United States Patent [19]

Zarubin

[11] Patent Number: 5,500,527
[45] Date of Patent: Mar. 19, 1996

[54] ELECTRON/ION MICROSCOPE WITH IMPROVED RESOLUTION

[76] Inventor: Alexander Zarubin, Friedrich-Ebert-Str. 43, D-48153 Munster, Germany

[21] Appl. No.: 365,043

[22] Filed: Dec. 27, 1994

[51] Int. Cl.$^6$ .................................................. H01J 37/26
[52] U.S. Cl. ............................................ 250/306; 250/311
[58] Field of Search ............................ 250/306, 307, 250/310, 311

[56] References Cited

U.S. PATENT DOCUMENTS

| | | | |
|---|---|---|---|
| 3,847,689 | 11/1974 | Fletcher et al. | 250/311 |
| 3,889,114 | 6/1975 | Jan Van Oosyum | 250/311 |
| 4,935,625 | 6/1990 | Hasegawa et al. | 250/311 |
| 5,192,867 | 3/1993 | Osakase et al. | 250/311 |
| 5,298,747 | 3/1994 | Ichikawa et al. | 250/311 |

Primary Examiner—Jack I. Berman
Attorney, Agent, or Firm—Eliot S. Gerber

[57] ABSTRACT

A new type of electron microscope comprises a charged particle source and a condensor that form a dark-field illumination system with an incident beam of a small spatial coherence width compared to the transverse dimensions of the specimen. An interferometer is positioned along a direction of scattering to produce the superposition of two lateral areas of the scattered beam to form interference and to vary the amount of shear. The microscope includes a rotation means for turning the direction of shearing relative to the scattered beam around the scattering direction. The interference fringes are recorded by a detector at different directions of shear with variable amount of shear within each shear direction. A data processor (digital computer) evaluates the visibility and the phase shift of the interference fringes to obtain Fourier components of an image of the specimen and to synthesize the image from those components. Aberrations of this microscope can be substantially reduced and its numerical aperture increased, resulting in a higher resolving power.

18 Claims, 3 Drawing Sheets

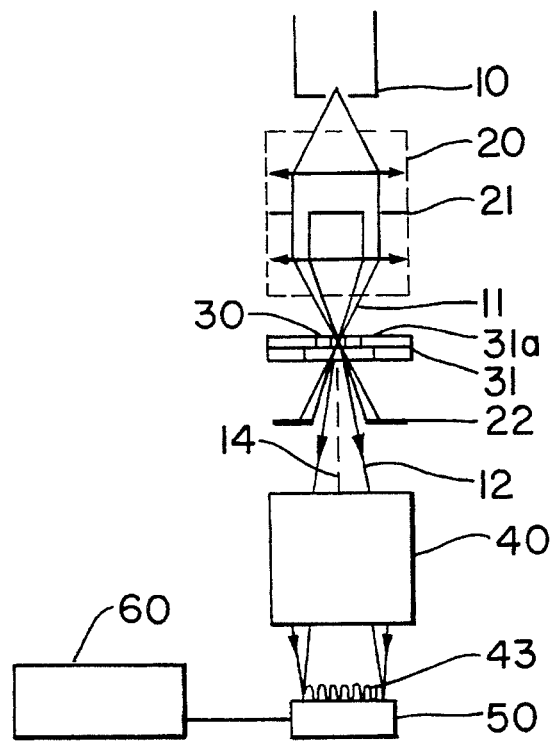
FIG. 1
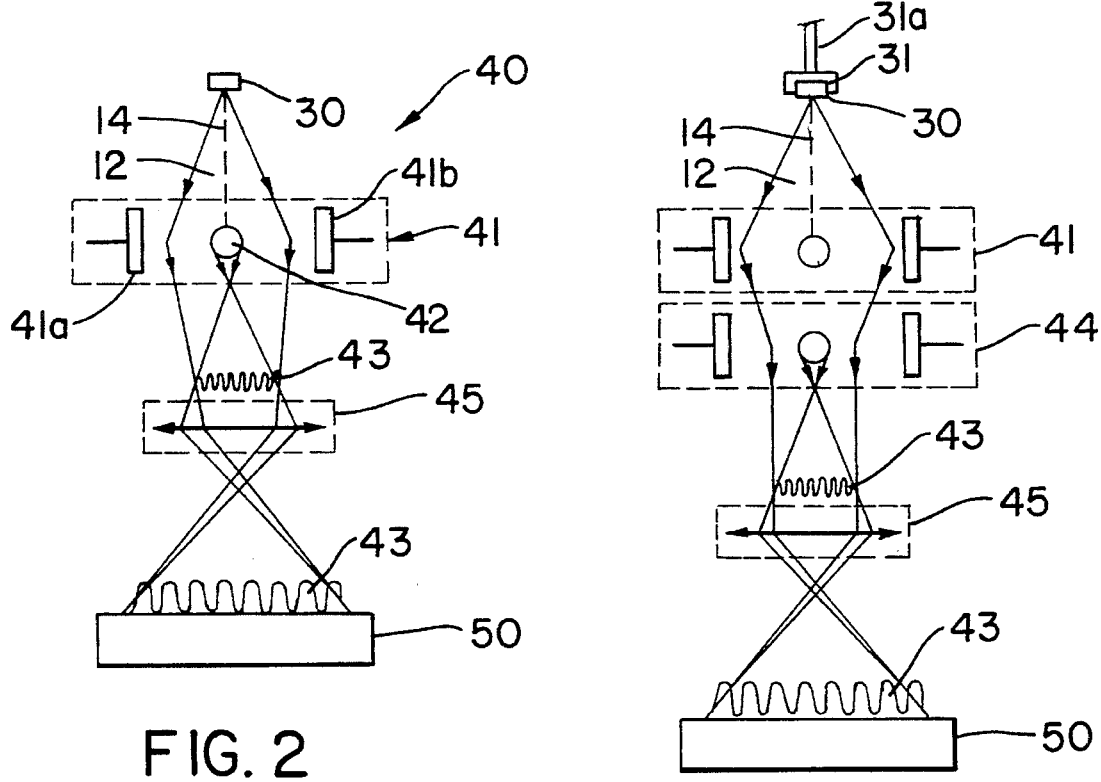
FIG. 2
FIG. 3

ELECTRON/ION MICROSCOPE WITH IMPROVED RESOLUTION

BACKGROUND OF THE INVENTION

The present invention relates to optical instruments and techniques for microscopic imaging using charged particles, in particular, to electron and ion microscopes.

Electron and ion microscopes are widely used in microscopic imaging. Image formation in the conventional electron (ion) microscope is a one-step process comprising the illumination of a specimen from a source of charged particles, the use of electron (ion) lenses for obtaining a magnified image, and the image recording by a detector. The resolving power of such a microscope is known to be limited by aberrations which inevitably accompany electron lenses.

Gabor's holographic electron microscope uses a two-step imaging process, consisting of recording a hologram of the specimen and reconstructing a magnified image, to compensate for such aberrations. The hologram recording requires spatial and temporal coherence of the interfering object and reference wave; therefore the condition that the spatial coherence width of the specimen illumination must be greater than the specimen width, is an essential feature of the holographic microscope. A modern modification of the holographic electron microscope employing "image-plane off-axis holography" (see, e.g., U.S. Pat. No. 4,935,635 (C1. 235–306) "Electron Holography Apparatus"), incorporated by reference, comprises a bright-field electron microscope having an electron source and condenser that provide an incident electron beam of spatial coherence radius greater than the transverse dimensions of the specimen which is located off-axis, electron lenses for obtaining a magnified image of the specimen, an electrostatic biprism for recombining the magnified image with the undisturbed part of the incident beam to form an image-plane hologram, an image detector for recording the hologram, and an image data processor used to analyze the hologram to reconstruct an image. However, the image resolution attainable with this microscope even after an aberration correction procedure, though improved compared to the resolution of conventional electron microscopes, cannot exceed the so-called information-resolution limit determined chiefly, among other factors, by the chromatic and spherical aberration of the objective lens. Another drawback of such a microscope is that for a three-dimensional specimen, the high-resolution image is not easily interpretable. This requires performing laborious image simulations on a computer.

SUMMARY OF THE INVENTION

The present invention seeks to provide an increase in the resolving power of microscopes operating with charged particles, i.e., electron and ion microscopes.

In accordance with the present invention, this objective is accomplished in a new type of microscope, the principle of operation of which is disclosed as follows. In coherence theory it is known for the scattering of partially coherent particle beams (in spatial domain), quasimonochromatic beams of charged particles, that the complex degree of transverse spatial coherence $\mu_1$ of the elastically scattered beam may be described within a small range of scattering angles about an arbitrary direction of scattering, according to the generalization of the Van Cittern-Zernike theorem in wave and particle scattering, by the normalized three-dimensional Fourier transform of the squared electrostatic potential distribution $\phi(r)$ in the scattering object, i.e.

$$\mu_\perp(\vec{s}_1, \vec{s}_2) = \frac{\int_D |\phi(\vec{r})|^2 \exp\{-i2\pi[(\vec{s}_1 - \vec{s}_2)/\lambda]\vec{r}\}d^3\vec{r}}{\int_D |\phi(\vec{r})|^2 d^3\vec{r}},$$

where $\vec{s}_1, \vec{s}_2$ are unit vectors pointing toward a pair of observation points, $\lambda$ is the mean wavelength of the incident particles, D is the domain of space occupied by the scattering specimen. The term "transverse" denotes that the observation point pairs are aligned laterally with respect to the direction of scattering.

Broadly speaking, the image formation process in the microscope of the present invention is based on the Fourier transformation relationship between the electrostatic potential distribution in a specimen and the complex degree of transverse spatial coherence of the scattered beam expressed by the above equation. Such a microscope comprises a source and a condensor that form a dark-field illumination system with an incident beam of spatial coherence radius which is small compared to the transverse dimensions of the specimen, an interferometer positioned along a direction of scattering to produce the superposition of two lateral (lateral relative to said direction) areas of the scattered beam to form interference fringes. The interferometer varies the distance between the areas made to interfere (called in interferometry the "shear amount"). The microscope includes a rotation means for turning the direction of shearing, produced by the interferometer, relative to the scattered beam around the direction of scattering. These interference fringes have their visibility and the phase shift determined by the complex degree of transverse spatial coherence of the scattered beam. A detector is positioned to make recordings of the interference fringes. The recordings are taken with different directions of shear, which are produced by said rotation means, with variable amount of shear within each single shear direction. A data processor, i.e., a digital computer, is used to evaluate the visibility and phase shift of said interference fringes from said recordings to obtain Fourier components of an image of the specimen and to synthesize the specimen image from these Fourier components. In this manner, a two-dimensional image of the specimen is synthesized. For providing three-dimensional image formation, a holder of the specimen rotates the specimen about an axis perpendicular to said direction of scattering, and for each rotation position the above-described procedure of obtaining the Fourier components is repeated.

In the prior art microscopes axially-symmetric electron lenses with a modulation transfer function extending in two dimensions must be used in order to provide image formation. However, a microscope in accordance with the present invention has an advantage that the image synthesis is provided by means of an interferometer having lenses with a modulation transfer function that extends only in one dimension (parallel to the direction of shearing) and that may be localized about a single spatial frequency located in this direction. Aberrations of such an optical system can be substantially reduced compared to the aberrations of the axially-symmetric lenses whereas the numerical aperture of this optical system, determined by the maximum shear amount, can be substantially increased. This results in a higher resolving power of the microscope of the present invention.

An additional advantage is that both two- and three-dimensional images of thick three-dimensional specimens are obtained directly, i.e., without any image simulations.

BRIEF DESCRIPTION OF THE DRAWINGS

The invention will now be described by way of example and with reference to the accompanying drawings, in which:

FIG. 1 is a diagrammatic representation of a microscope according to this invention;

FIG. 2 is a diagrammatic illustration of an embodiment of an interferometer in accordance with this invention;

FIG. 3 is a diagrammatic illustration of a second embodiment of the interferometer;

DETAILED DESCRIPTION

Figure 6:
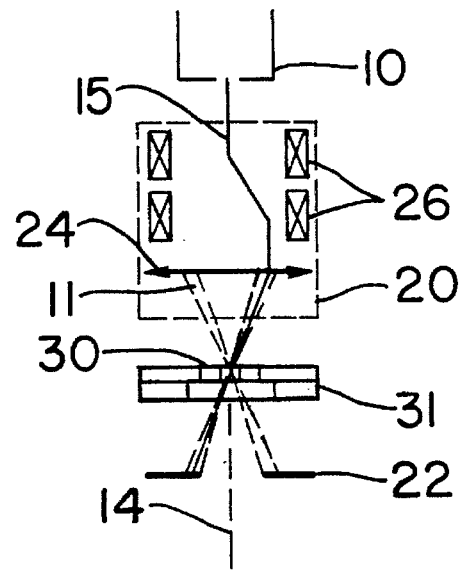
FIG. 6 illustrates a second embodiment of the illumination system.

FIG. 1 illustrates a electronic microscope of the present invention working in a transmission mode, which is the mode usually used with thin specimens. A source of charged particles 10 (electrons or ions) and a condensor 20 form a dark-field hollow-cone illumination system that may comprise lenses 23,24 and an annular aperture 21, the gap of which is focused to an aperture 22, usually of circular form, placed in the transmission mode behind a specimen 30. This illumination system produces a hollow-cone shaped incident charged particle beam 11 having a small spatial coherence radius compared to the transverse dimensions of the specimen. Alternatively, such a hollow-cone illumination with a small spatial coherence width may be produced by using one or more deflection coils 26 and a lens 24 as shown in FIG. 6. A particle beam 15 from the source 10 is tilted over an angle and then rotated continuously about the optical axis 14 by the action of the deflection coils 26. The lens 24 focuses the beam onto the specimen so that a specimen point serves as a pivot. The angle of tilt is then changed in such a way that the beam fills in the interior of a hollow cone 11 with the pivot in the specimen. An aperture 22 blocks the unscattered beam. In transmission mode the charged particles (electron/ions) pass through the sample. Part of the scattered beam 12 passes through the aperture 22 and an interferometer 40, that is positioned along a scattering direction 14, to produce interference fringes 43 which are generally linear. The fringes 43 are recorded by an electron detector 50 and processed by a data processor 60, generally a digital computer.

Since the charged particles are scattered by air electron/ion microscopes are constructed within a housing and evacuated to a high vacuum. The diagrams of the enclosed figures show microscopes within an evacuated housing. The condensor lenses 23,24 may be conventional and may be a metal ring wound with a current carrying wire to form magnetic fields which shape and bend the beams of charged particles. The charged particle source 10, in the case of electrons, may be a filament maintained at a negative of 50–1000 kV.

For work with bulky specimens, a reflection mode may be realized in a microscope that uses a beam which is scattered by the specimen through large angles. In such a microscope, the aperture 22, interferometer 40 and detector 50 are positioned along a direction of scattering on the source side relative to the specimen.

An interferometer 40, formed in accordance with the invention (FIG. 2) comprises an electrostatic biprism 41 having a variable voltage applied to the biprism filament 42.

Figure 7:
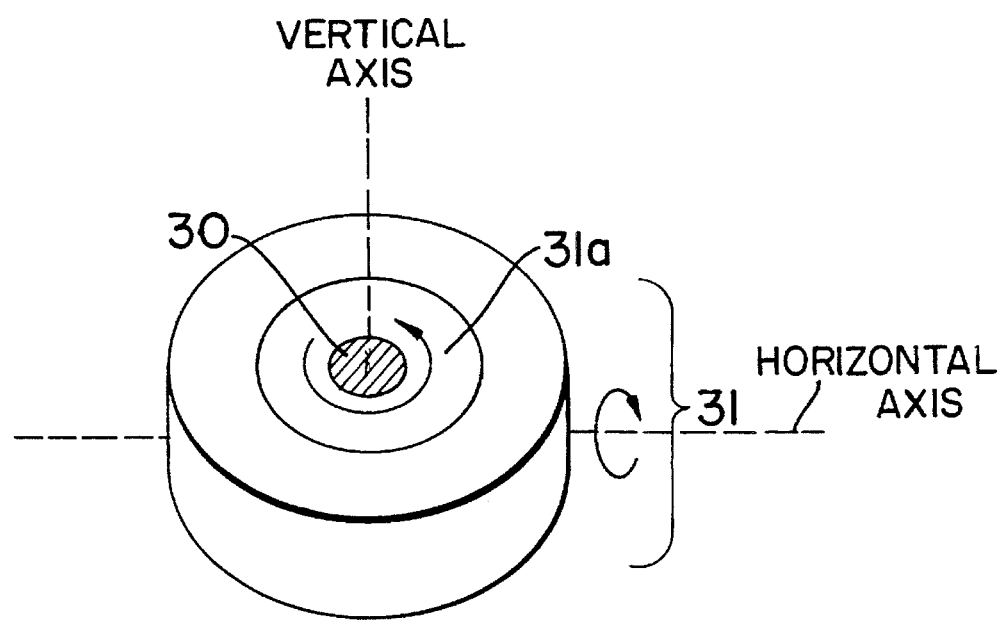
FIG. 7 is a perspective view of a rotational device.

By the action of the biprism, the superposition of two charged particle beams is produced. Those two beams are lateral relative to the scattering direction 14. The biprism 41 deflects the two beams towards each other. The filament voltage controls the angle of deflection and, therefore, the amount of shear of the scattered beam areas made to interfere. The direction of shearing produced by the interferometer is changed by a rotation means, for example, by a specimen holder 31 having goniometer means (FIG. 7) to rotate the specimen 30 around the scattering direction and optical axis 14. Alternatively, the same may be achieved by rotating the biprism 41 around said direction by means of a step motor (not shown) while the specimen is kept constant, or by using a magnetic rotation of the scattered beam which will be described below. A suitable electrostatic biprism comprises two grounded rectangular electrode plates 41a and 41b of conducting material and each 5 mm long and 2 mm high. A variable voltage having, for example, a sawtooth form, is applied to the filament 42. For electron sources with accelerating voltage in the range of a few hundred kilovolts, that voltage is typically varied from 0 to a few kilovolts to produce the desired variation in deflection angle and in amount of shear. For ions, the biprism voltage is reduced in proportion to the ion charge.

The fringes 43 may be magnified in the direction perpendicular to them by using an optical system 45 that forms a magnified image in the plane of the detector 50, for example, a CCD (Charge Coupled Device) array having a scintillating screen. For increasing the brightness and signal-to-noise ratio of the recordings, an anamorthic optical system 45 is used to demagnify the interference fringes 43 along their direction while magnifying them in the perpendicular direction. Because the spacing of the fringes 43 changes with the shear amount, the optical system 45 has a one-dimensional modulation transfer function extending in the direction of shearing.

In the preferred embodiment of a microscope according to the present invention, a second electrostatic biprism 44 is placed after the first one downstream along the scattered beam (FIG. 3). By changing the filament voltage of the biprism 44 in accordance with that necessary for shearing voltage variations on the biprism 41, the angle between the interfering beams and the spacing of the interference fringes 43 is retained within a predetermined range while the amount of shear is varied. In such a microscope, the optical system 43 may have a modulation transfer function localized at a single spatial frequency, the value of which can be chosen low enough to reduce aberrations. Thus, the aberrations of a microscope formed in accordance with the invention may be substantially reduced compared to the aberrations of the prior art microscopes while the deflection angle, which determines the numerical aperture of this microscope, can be made greater than the numerical aperture of the prior art microscope. This provides a gain in resolution.

Figure 4:
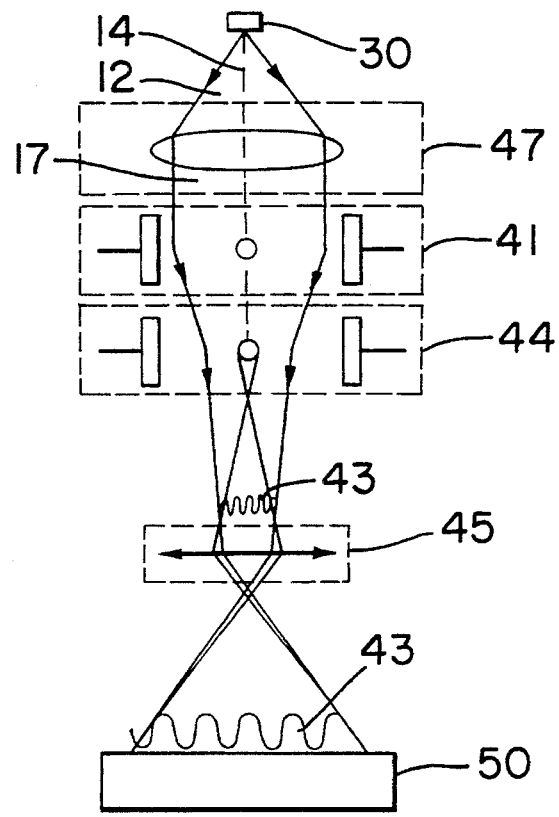
FIG. 4 shows a diagrammatic representation of an optical arrangement for an interferometer.

FIG. 4 illustrates an objective lens 47 placed across the scattering direction 14 along which the interferometer 40 is positioned. A divergent beam 12 scattered from the specimen 30 is transformed by the lens 47 into a collimated or convergent beam 17 to form the interference fringes 43 as described above, for example, by means of electrostatic biprisms 41,44. The fringes 43 may be magnified by using an optical system 45.

In the case of a collimated beam 17, the necessity for shearing voltage variations applied to the biprism 41 are considerably reduced and amount to, for the above-describe example of a biprism, a few hundred volts. The introduction of the lens 47 into an interferometer 40 makes possible the superposition of scattered beam areas that propagate at relatively large angles with respect to the scattering direction 14, and which therefore take on a large lateral separation. Thus, a gain is provided in the amount of shear (lateral separation) of the scattered beam areas that can be made to interfere, which is accompanied by the corresponding gain in resolution.

The lens 47 may include a magnetic rotation lens to rotate the scattered beam about the scattering direction 14. This lens thus serves as the rotation means for turning the direction of shear relative to the scattered beam. Owing to the symmetry of the interferometer, the spherical and other symmetrical aberrations introduced by the lens into the scattered beam are automatically canceled in interference in the axis of symmetry which determines the central fringe and can be calibrated and compensated for other fringes. Thus, as has been pointed out above, the aberrations of a microscope formed in accordance with the present invention may be substantially reduced compared to the aberrations of the prior art microscopes.

Figure 5:
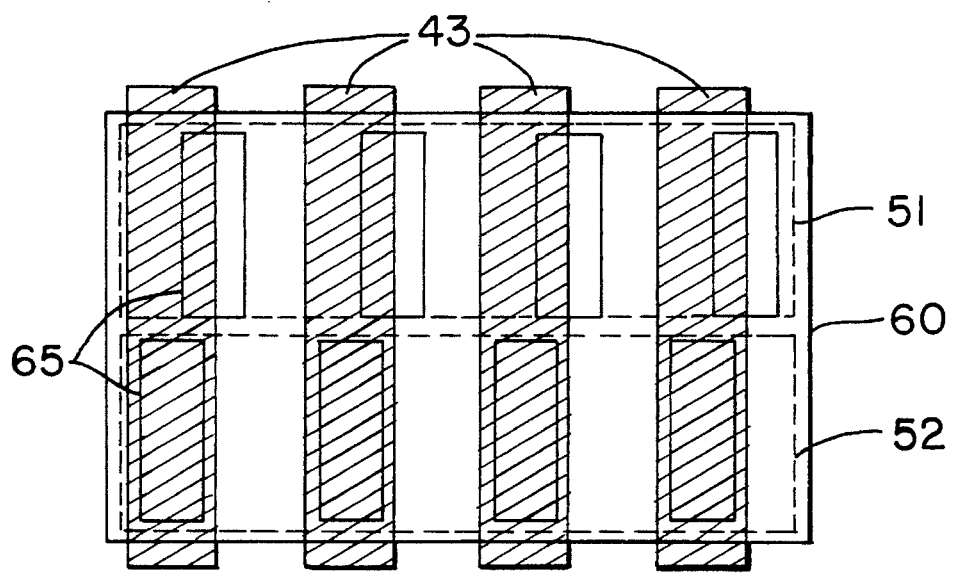
FIG. 5 illustrates an arrangement for a detector.

A spacing of the interference fringes 43 (FIG. 5) formed in accordance with the invention can be kept constant while varying the shear amount. A mask 60 with slits 65, aligned parallel to the fringes and spaced at intervals of the fringe spacing, is mounted atop two detectors 51,52 located adjacent to one another within the region occupied by the interference fringes 43. The slit positions in the area of the mask 60 covering one of the detectors are shifted in the direction perpendicular to the fringes with respect to the slit positions in the mask area covering the other detector by a quarter of the fringe spacing. By this means the detectors 51,52, for example, photoelectron multipliers coupled to a scintillator, take recordings of the inphase and quadrature portion of the interference fringes from which, in accordance with the invention, the visibility and the phase shift of the fringes are then evaluated.

What is claimed is:

1. A microscope having a source means (10) for producing charged particles and a condenser means (20) to form an electron or ion particle beam incident on a specimen (30) thereby forming a scattered particle beam having an optical axis (14) and comprising a specimen holder (31) and a detector (50), characterized in that:

the source means (10) and the condenser means (20) form a dark-field illumination system with an incident beam whose spatial coherence radius is less than the transverse dimensions of the specimen (30), and in that the microscope comprises an interferometer means (40) positioned along the optical axis for forming interference fringes by superposing two lateral areas of the scattered particle beam which are separated by a variable shear distance;

rotation means for turning the direction of shear, produced by the interferometer, relative to the scattered beam around said optical axis;

the detector (50) being positioned to take recordings of said interference fringes, and data processor means (60) for evaluating the visibility and the phase shift of said interference fringes from said recordings for obtaining Fourier components of an image of the specimen and to synthesize the specimen image from said Fourier components.

2. A microscope as claimed in claim 1 characterized in that for providing three-dimensional imaging of the specimen the specimen holder (31) includes means to rotate the specimen about an axis located perpendicular to the optical axis (14).

3. A microscope as claimed in claim 1 characterized in that said dark-field illumination system is a hollow-cone illumination system.

4. A microscope as claimed in claim 3 characterized in that said dark-field hollow-cone illumination system includes an annular aperture (21) the gap of which is focused to another aperture (22) that blocks the unscattered beam.

5. A microscope as claimed in claim 1 characterized in that said interferometer means (40) comprises an electrostatic biprism (41) having a filament (42) and means to apply a variable voltage to the biprism filament (42) for varying the variable shear distance.

6. A microscope as claimed in claim 1 characterized in that said interferometer means (40) comprises two electrostatic biprisms (41,44) placed one after the other downstream along the scattered beam and each having a filament and means to apply variable voltages to the two biprism filaments to retain the spacing of said interference fringes within a predetermined range when varying the variable shear distance.

7. A microscope as claimed in claim 1 characterized in that said interferometer means (40) comprises an optical systems means (45) to form an image of said interference fringes on said detector and to magnify said image in one direction.

8. A microscope as claimed in claim 7 characterized in that said fringes are parallel and optical systems means (45) is anamorphic to demagnify said image in the direction parallel to the fringes and in the plane of said detector.

9. A microscope as claimed in claim 1 characterized in that said rotation means is a specimen holder (31) which includes means to rotate the specimen around said optical axis.

10. A microscope as claimed in claim 1 characterized in that said detector (50) includes an array of charge-coupled devices (CCD).

11. A microscope as claimed in claim 1 characterized in that the interferometer means (40) also comprises a lens (47) placed perpendicular to said optical axis and located between said specimen and said interferometer.

12. A microscope as claimed in claim 1 characterized in that the interference fringes are parallel to each other, and the detector (50) comprises two detectors (51,52) located adjacent to one another within a region occupied by the interference fringes and a mask (60) mounted atop the detectors (51,52) and having slits (65) aligned parallel to the fringes and positioned at intervals of fringe spacing, the slits in the mask being positioned over one of the detectors and being shifted in a direction perpendicular to the fringes with respect to the slits in the mask area covering the other detector by a quarter of fringe spacing.

13. A microscope as claimed in claim 11 characterized in that the lens (47) includes a magnetic rotation means to rotate the scattered beam around said optical axis.

14. A microscope as claimed in claim 3 characterized in that said dark-field hollow-cone illumination system includes one or more deflection coils (26) that rotate the incident beam within a hollow cone (11) and an aperture (22) that blocks the unscattered beam.

15. A microscope as claimed in claim 14 characterized in that said dark-field hollow-cone illumination system includes a lens (27) that focuses the incident beam onto the specimen (30).

16. A microscope as claimed in claim 1, in which the interferometer means may be adjusted to vary the amount of shear, the direction of shear, or amount of tilt.

17. A microscope as claimed in claim 1 characterized in that the interferometer means (40) comprises a series of biprisms and an objective lens (47) which lies between the specimen and the first of said biprisms.

18. A microscope as claimed in claim 1 which includes means to rotate the specimen about said optical axis and means to rotate the specimen about an axis located perpendicular to the optical axis (14).

* * * * *